(12) United States Patent
Gao

(10) Patent No.: US 11,612,083 B2
(45) Date of Patent: Mar. 21, 2023

(54) SYSTEM AND METHOD FOR PHASE-CHANGE COOLING OF AN ELECTRONIC RACK

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 92 days.

(21) Appl. No.: 17/194,143

(22) Filed: Mar. 5, 2021

(65) Prior Publication Data
US 2022/0287207 A1    Sep. 8, 2022

(51) Int. Cl.
*H05K 7/20* (2006.01)
*F25B 6/04* (2006.01)

(52) U.S. Cl.
CPC .......... *H05K 7/20818* (2013.01); *F25B 6/04* (2013.01); *H05K 7/20318* (2013.01); *H05K 7/20736* (2013.01)

(58) Field of Classification Search
CPC ......... F25B 6/02; F25B 6/04; H05K 7/20818; H05K 7/20318; H05K 7/20736
USPC .................................................. 361/679.47
See application file for complete search history.

(56) References Cited

U.S. PATENT DOCUMENTS

| | | | |
|---|---|---|---|
| 3,529,432 A * | 9/1970 | Nussbaum ............. | F25B 39/04 62/196.3 |
| 7,522,418 B2 | 4/2009 | Ishimine | |
| 10,162,396 B2 * | 12/2018 | Cui .................... | H05K 7/20772 |
| 10,225,957 B2 * | 3/2019 | Gao .................... | H05K 7/20772 |
| 2008/0186679 A1 * | 8/2008 | Matsushima .......... | G11B 33/08 |
| 2011/0056225 A1 * | 3/2011 | Campbell ........... | H05K 7/20381 62/223 |
| 2012/0111036 A1 * | 5/2012 | Campbell ............... | F25B 49/02 62/434 |
| 2013/0168059 A1 * | 7/2013 | Werner ............... | F28D 15/0266 165/104.19 |
| 2015/0109730 A1 * | 4/2015 | Campbell ........... | F28D 15/0266 165/104.27 |
| 2018/0038660 A1 | 2/2018 | Dinnage et al. | |
| 2019/0182990 A1 * | 6/2019 | Chen .................. | H05K 7/20736 |
| 2021/0368648 A1 | 11/2021 | Chiba et al. | |

FOREIGN PATENT DOCUMENTS

WO    2019/146535 A1    8/2019

* cited by examiner

*Primary Examiner* — Anatoly Vortman
(74) *Attorney, Agent, or Firm* — Womble Bond Dickinson (US) LLP

(57) ABSTRACT

According to one embodiment, a cooling system includes a primary condenser, a primary supply line and a primary return line that couples the primary condenser to a cold plate that is arranged to be used for electronics cooling to create a primary heat-transfer loop in which the condenser supplies liquid coolant to the cold plate and receives vapor produced by the cold plate, a secondary condenser, a secondary supply line that couples the secondary condenser to the primary supply line, a secondary return line that couples the secondary condenser to the primary return line, and a primary valve that is coupled to the secondary return line, where, in response to vapor pressure exceeding a pressure threshold, the valve at least partially opens to create a secondary heat-transfer loop in which the secondary condenser condense vapor back into liquid coolant that is supplied to the primary supply line.

20 Claims, 5 Drawing Sheets

SYSTEM AND METHOD FOR PHASE-CHANGE COOLING OF AN ELECTRONIC RACK

FIELD

Embodiments of the present disclosure relate generally to a cooling system for phase-change cooling of an electronic rack.

BACKGROUND

Thermal management for a data center that includes several active electronic racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment. The CRAC is an air cooling unit that is widely used in existing air cooled data centers, and there are many other types of solutions for air cooled data centers. Also, a majority of existing data centers are air cooled.

Recently, data centers have been deploying more high-power density electronic racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs). Cooling these high-density racks by maintaining a proper thermal environment may be an issue with existing cooling systems, such as a data center air cooling systems. For instance, although the air systems unit may maintain the thermal environment with more conventional (or lower-density) racks, the unit may be unable to effectively cool high-power density racks because they may generate heat load at a higher rate due to the higher density electronics. In some cases, liquid cooling becomes a more efficient and feasible cooling solution in high power density or high heat flux scenarios.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
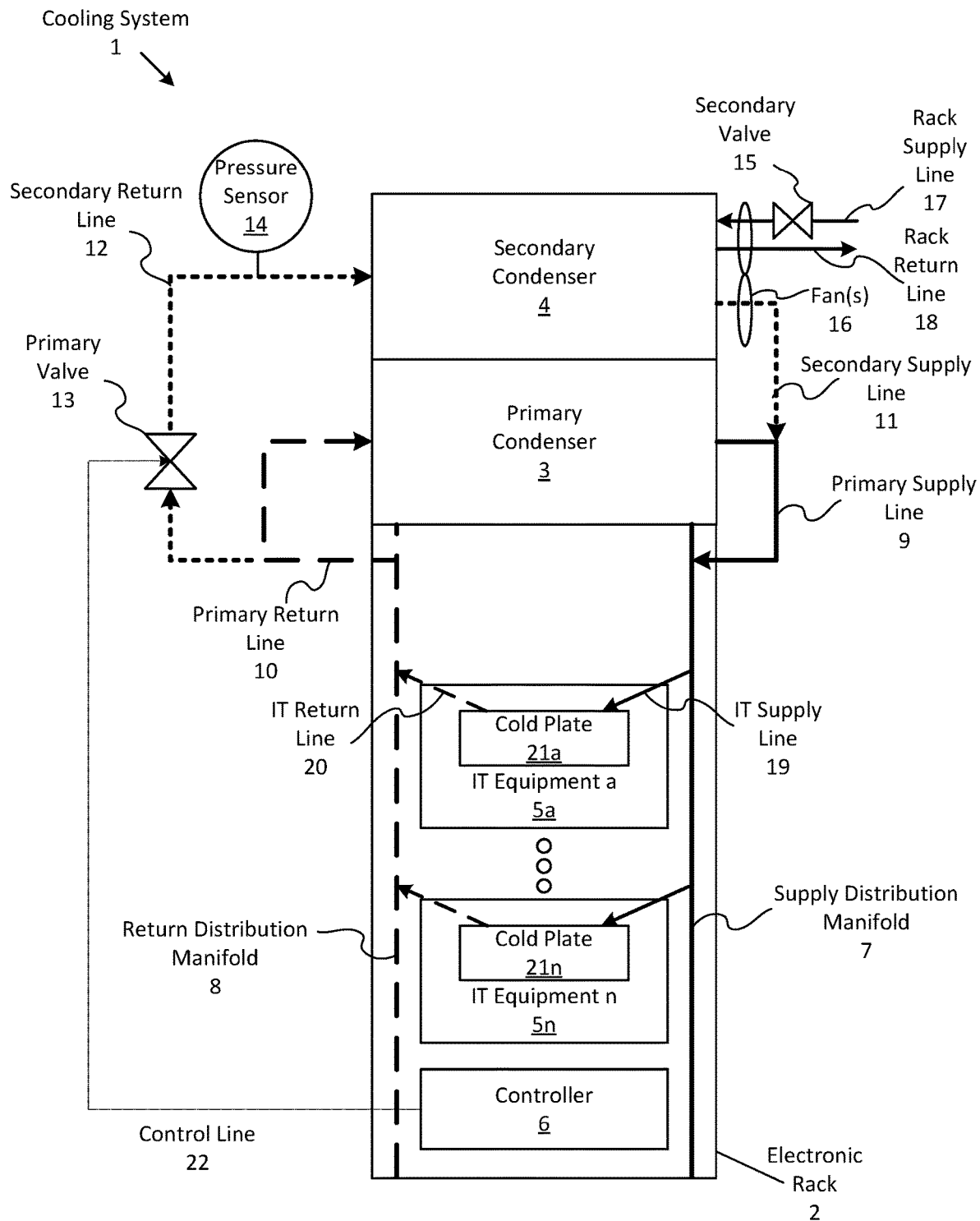
FIG. 1 is a block diagram illustrating an example of a cooling system that is cooling pieces of information technology (IT) equipment with a primary condenser according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Various embodiments of the present disclosure describe a phase-change cooling system for (e.g., high-power density) electronic racks, which may be populated within a data center room. The cooling system solution uses two-phase changing technologies in designing two heat-transfer loops: a first (or primary) heat-transfer loop for constantly moving heat generated by pieces of information technology (IT) equipment and a second (or secondary) heat-transfer loop for moving additional heat generated by the pieces of IT equipment during high-power workloads (e.g., while the power density of the electronic rack is above the power threshold). The primary heat-transfer loop may include a primary condenser that is coupled to one or more cold plates that are mounted on IT components (e.g., processors) of IT equipment in the rack. Liquid coolant may flow from the primary condenser to the cold plate, which produces vapor when heat generated by the IT component is transferred into the liquid coolant by the cold plate. This vapor may then be condensed by the primary condenser back into liquid coolant, which is then fed back into the cold plates.

The secondary heat-transfer loop may include a secondary condenser that is coupled to the cold plates via a primary valve, which while the electronic rack is under "nominal" or normal operating conditions (e.g., while the power density is below the power threshold) remains closed and the rack is cooled using the primary heat-transfer loop. When, however, vapor pressure within the system increases above a pressure threshold, the primary valve may open and thereby allowing vapor to be condensed by the secondary condenser. Such a scenario may occur under high-power workload conditions of the electronic rack in which excess heat generated by the IT components cause the cold plates to produce more vapor thereby increasing the vapor pressure within the closed system. When the vapor pressure decreases (e.g., the rack returning to nominal operating conditions in which the rack is drawing less power), the pressure valve may close and the system may then be cooled using the primary heat-transfer loop without the secondary loop. Thus, the primary condenser of the primary heat-transfer loop may provide a fixed and constant cooling capacity (e.g., without any control by the system), regardless of the power drawn by the electronic rack. The cooling system described herein provides may advantages. For example, the system is designed as a self-regulating system for better performance under different operating conditions and allows high variations in both the cooling capacity of the heat-transfer loops and the heat load generations of the IT equipment. In addition, the system, enables a cost-effective control in which the secondary condenser is only used as-needed. Also, the cooling system reduces complexity by having the primary heat-transfer loop provide sufficient and constant cooling while the rack operates under normal operating conditions.

In addition, the cooling system may reconfigure (or adjust) an opening pressure of the primary valve based on changes to the cooling requirements of the electronic rack. For example, the pressure threshold at which the primary valve opens may be based on a configuration of the electronic rack (e.g., the number and type of pieces of IT equipment mounted within the rack) and a cooling capacity of the primary condenser. If either of these change (e.g., the configuration of the rack changes by replacing, adding, and/or removing pieces of IT equipment mounted within the rack) the pressure threshold may change as well. For example, as more high-power density equipment is added into the rack, the maximum power density of the entire configuration may increase. This may require a reduction in the pressure threshold than when the rack is populated with lower power density equipment, due to a corresponding increase in heat that will be generated by and will need to be moved from the added high-power density equipment. Thus, the cooling system is able to control the addition of the cooling capacity of the secondary condenser with the cooling capacity of the primary condenser (which remains constant) to cool the electronic rack by adjusting the opening pressure of the primary valve according to a current configuration of the electronic rack.

According to one embodiment, a cooling system for an electronic rack includes a primary condenser; a primary supply line and a primary return line that couples the primary condenser to a cold plate that is arranged to mount on an IT component of a piece of information technology (IT) equipment that is disposed within the electronic rack to create a primary heat-transfer loop in which the primary condenser 1) supplies, via the primary supply line, liquid coolant to the cold plate and 2) receives, via the primary return line, vapor that is produced by the cold plate when heat generated by the IT component is transferred into the liquid coolant by the cold plate; a secondary condenser; a secondary supply line that couples the secondary condenser to the primary supply line; a secondary return line that couples the secondary condenser to the primary return line; and a primary valve that is coupled to the secondary return line. The primary valve is configured to at least partially open in response to a pressure of the vapor exceeding a pressure threshold of the primary valve, and, in response to the primary valve at least partially opening, a secondary heat-transfer loop is created in which the secondary condenser receives, via the secondary return line, at least a portion of the vapor and condenses the at least the portion of the vapor back into liquid coolant that is supplied, via the secondary supply line, to the primary supply line.

In one embodiment, the cooling system further includes either 1) a fan that is arranged to move ambient air over a cooling coil of the secondary condenser or 2) a rack supply line and a rack return line that couples the secondary condenser to a cooling source and a secondary valve that is coupled to either the rack supply line or the rack return line, which depends on the cooling method for the secondary cooling condenser, either an air-cooled condenser or a liquid-cooled condenser. In some embodiments, the cooling system further includes a pressure sensor that is coupled to the secondary return line and is communicatively coupled to either the fan or the secondary valve, wherein the pressure sensor is configured to sense vapor pressure within the secondary return line, and adjust either 1) a fan speed of the fan or 2) an open ratio of the secondary valve based on the sensed pressure.

In one embodiment, the cooling system further includes a controller that is communicatively coupled to the primary valve, wherein the controller is configured to determine the pressure threshold based on at least one of a maximum power threshold of the electronic rack and a cooling capacity of the primary condenser, and set an opening pressure of the primary valve according to the pressure threshold.

In some embodiments, the cooling system further includes a supply distribution manifold that couples the primary supply line to the cold plate; and a return distribution manifold that couples the primary return line to the cold plate. In another embodiment, the cooling system further includes a liquid coolant buffer that is coupled between the primary supply line and the supply distribution manifold. In one embodiment, the secondary condenser is positioned above the primary condenser, which is positioned above the piece of IT equipment, wherein vapor and liquid coolant circulates through each of the primary and secondary heat-transfer loops without any vapor pumps and without any liquid pumps. In another embodiment, the primary condenser is a first type of two-phase heat exchanger and the secondary condenser is a second type of two-phase heat exchanger.

According to one embodiment, an electronic rack includes several pieces of information technology (IT) equipment arranged in a stack for providing data processing services, each piece of IT equipment including one or more processors, and includes at least some components of the cooling system described herein.

According to another embodiment, a method for liquid cooling an information technology (IT) component of a piece of IT equipment that is mounted within an electronic rack includes determining a vapor pressure within a primary heat-transfer loop in which a cold plate mounted on the IT component is coupled to a primary condenser with 1) a primary supply line that supplies liquid coolant to the cold plate, and 2) a primary return line that returns vapor produced by the cold plate when heat generated by the IT component is transferred into the liquid coolant by the cold plate to the primary condenser; in response to determining that the vapor pressure within the primary heat-transfer loop exceeds a pressure threshold, opening a closed primary valve that couples the primary return line to a secondary condenser that is coupled to the primary supply line with a secondary supply line, wherein upon the opening of the primary valve a secondary heat-transfer loop is created in which at least a portion of the vapor is condensed by the secondary condenser back into liquid coolant that is supplied, via the secondary supply line, to the primary supply line; and in response to determining that the vapor pressure within the primary heat-transfer loop does not exceed the pressure threshold, maintaining closure of the closed primary valve such that only the primary condenser condenses the vapor back into liquid coolant.

In one embodiment, the primary valve is coupled to a secondary return line that couples the primary return line to the secondary condenser, wherein the method further includes: sensing pressure of vapor within the secondary return line; and adjusting either 1) a fan speed of a fan that is arranged to move ambient air over a cooling coil of the secondary condenser or 2) an open ratio of a secondary valve that couples the secondary condenser to a liquid cooling source based on the sensed pressure. In some embodiments, the method further includes: determining the pressure threshold based on at least one a maximum power threshold of the electronic rack and a cooling capacity of the primary condenser; and setting an opening pressure of the primary valve according to the pressure threshold. In one embodiment, the method further includes determining a new maximum power threshold of the electronic rack based on a change to a configuration of the electronic rack, determining a new pressure threshold based on at least the new maximum power threshold, and setting the opening pressure of the primary valve according to the new pressure threshold.

In one embodiment, as used herein, "to couple" one component (or element) to another component may refer to "fluidly" coupling the two components so that a fluid, such as a cooling liquid or a liquid coolant (or a vapor) may flow between the two components. For example, coupling a first tube to a second tube may couple both tubes together so as to allow a fluid to flow from the first tube into the second tube.

FIG. 1 is a block diagram illustrating an example of a cooling system 1 that is cooling pieces of information technology (IT) equipment with a primary condenser according to one embodiment. In particular, this figure shows (e.g., phase-change liquid) cooling system 1 that includes a primary condenser 3, a secondary condenser 4, a controller 6, a primary valve 13, a pressure sensor 14, a fan 16, a secondary valve 15, a primary supply line 9, a secondary supply line 11, a supply distribution manifold 7, a primary return line 10, a secondary return line 12, and a return distribution manifold 8. In one embodiment, the system may include more or less components (or elements) as shown herein. For example, the system may include one or more pressure sensors, one or more fans, and/or one or more (additional) valves. As another example, the system may include either the fans 16 or the secondary valve 15, as described herein.

This figure also illustrates an electronic rack 2 that includes one or more pieces of IT equipment 5a-5n that are arranged in a stack. In one embodiment, the electronic rack may include one or more (server) slots that are designed to each contain one or more pieces of IT equipment. Each piece of IT equipment may include one or more IT components (e.g., one or more processors, central processing units or CPUs, graphical processing units (GPUs), memory, and/or storage devices). The IT component may perform data processing tasks, where the IT component may include software installed in a storage device, loaded into the memory, and executed by one or more processors to perform the data processing tasks. In one embodiment, the piece of IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs or different types of accelerators) managed by the host server. The IT component (e.g., processor) performs computational tasks, which may generate heat. This heat, as described herein needs to be transferred away from the component in order to ensure that it does not overheat, which may result in failure.

Each piece of IT equipment 5a-5n includes at least one cold plate 21a-21n that is arranged to mount on an IT component (not shown) of a respective piece of IT equipment. Each of the cold plates is designed to phase-change liquid cool one or more IT components on which the cold plate is mounted. For instance, the cold plate receives liquid coolant and produces vapor when heat generated by the IT component on which the cold plate is mounted is transferred into the liquid coolant by the cold plate. More about the cold plates is described herein.

In one embodiment, the liquid coolant may be any type (or one or more types) of phase-change-liquid (or fluid). In some embodiments, the coolant may have a boiling point that enables the coolant to change phase (e.g., into a gas or vapor) based on (e.g., IT components mounted on) the piece of IT equipment on which the cold plate is mounted. Specifically, the coolant may have a boiling point below (or at) an operational temperature threshold of the IT component (e.g., a temperature of the IT component resulting in heat generated by the IT component when drawing a predefined power density, such as a case temperature of a chip).

As illustrated herein, at least some of the components of the cooling system 1 are (at least partially) contained (or disposed) within the electronic rack 2. For instance, the pieces of IT equipment 5a-5n, the controller 6, the supply and return distribution manifolds 7 and 8, and the primary and secondary condensers 3 and 4 are contained within the electronic rack. In another embodiment, less or more (or all) of the components of the cooling system 1 illustrated within this figure may be contained within the rack. Thus, in this example, the cooling system may be fully contained (or enclosed) within the rack 2. In another embodiment, one or more components may be disposed outside of the rack. For example, both (or at least one) of the condensers may be placed atop (and/or outside of) the rack. As another example, the fan 16 and/or the secondary valve 15 may be positioned outside of and coupled to the rack. For instance, the fan 16 may be coupled to (e.g., a backend of) the rack in order to push (or pull) ambient (e.g., data center room cooling) air. As another example, the controller 6 may be disposed outside of the rack (e.g., contained within a different rack).

The primary condenser 3 may be any type of two-phase heat exchanger (e.g., a liquid-to-liquid heat exchanger, a liquid-to-air heat exchanger, etc.) that is designed to condense vapor into a cooled (condensed) liquid (or condensate). Similarly, the secondary condenser 4 may be any type of two-phase heat exchanger. In one embodiment, the cooling system 1 may include either the fan(s) 16 or the secondary valve 15 based on which type of heat exchanger the secondary condenser includes. For example, if the secondary condenser is a liquid-to-air heat exchanger, the cooling system may include the one or more fans 16 that are arranged to move cooling air over (at least one) cooling coil of the secondary condenser. Then the cooling air is used for cooling the vapor flowing into the cooling coil. Otherwise, if the secondary condenser is a liquid-to-liquid heat exchanger, the cooling system includes a secondary valve 15 that may be coupled to either 1) a rack supply line 17 that supplies liquid coolant from a cooling source (e.g., a data center's cooling liquid system) to the secondary condenser 4 or 2) a rack return line 18 that returns warmed liquid coolant to the cooling source. Then, the cooling liquid is used for cooling the vapor. In one embodiment, both condensers may be different types of heat exchangers (e.g., the primary condenser being a liquid-to-liquid heat exchanger, while the secondary condenser being a liquid-to-air heat exchanger). In some embodiments, the cooling system 1 may include additional fans, valves, and supply/return lines for cooling the primary condenser. In another aspect, the cooling system may include additional condensers that are coupled to the cold plates, as described herein.

As illustrated, the primary supply line 9 and the primary return line 10 couple the primary condenser 3 to one or more cold plates 21a-21n in order to create a primary heat-transfer loop (e.g., one loop for each cold plate). Specifically, the primary supply line couples the primary condenser to the supply distribution manifold 7, and the primary return line couples the primary condenser to the return distribution manifold 8. Thus, the supply manifold and the return manifold are configured to (e.g., removeably) couple one or more cold plates to the primary supply and return lines, respectively, such that heat-transfer loops for the cold plates may be added to or removed from the cooling system 1. In particular, each cold plate couples to the supply distribution manifold via an IT supply line 19, and similarly each cold plate couples to the return distribution manifold via an IT return line 20, as shown with respect to cold plate 21a. As described herein, the primary heat-transfer loop draws heat away from (e.g., IT components on which cold plates are mounted on the) IT equipment. For instance, the primary condenser supplies liquid coolant (e.g., condensate) via the primary supply line 9 to the supply distribution manifold, which then distributes and supplies the coolant to each cold plate 21a-21n, via IT supply lines 19. The cold plate heats the liquid coolant into vapor, which flows into the return distribution manifold via IT return lines 20. The vapor then flows from the return manifold into the primary return line 10, from which the primary condenser 3 receives the vapor to be condensed back into liquid coolant.

The secondary condenser 4 is coupled in parallel with the primary condenser 3. As shown, the secondary supply line 11 couples the secondary condenser 4 to the primary supply line 9, and the secondary return line 12 couples the secondary condenser to the primary return line 10 in order to create a secondary heat-transfer loop (e.g., under certain operational conditions of the electronic rack, such as when the electronic rack is processing a high-power workload, as described herein). More about the secondary heat-transfer loop is described herein. In one embodiment, the secondary condenser may be coupled differently. For instance, the secondary supply line may couple to the supply distribution manifold 7, rather than coupling to the primary supply line. Coupled to the secondary return line is the primary valve 13 and the pressure sensor 14. In one embodiment, the secondary return line may include two portions, a first portion of the secondary return line that is coupled between the primary return line and the primary valve, and a second portion of the return line that is coupled between the secondary condenser and the primary valve and to which the pressure sensor is coupled. In one embodiment, the pressure sensor may be coupled to the first portion of the secondary return line.

In one embodiment, the primary valve 13 is configured to control a flow of vapor from the primary return line (and through the secondary return line) and into the secondary condenser 4. In one embodiment, the primary valve may be a pressure valve that is configured to at least partially open in response to a vapor pressure in the primary heat-transfer loop (e.g., vapor pressure in the primary return line 10) exceeding a pressure threshold. For instance, the primary valve may have an opening pressure (e.g., a pressure at which the valve at least partially opens) that is defined (or set) according to the pressure threshold. Thus, upon the opening of the primary valve, the secondary heat-transfer loop is created thereby allowing vapor to flow into the secondary condenser in response to the at least partial opening of the primary valve 13. In particular, when the valve is open, vapor (or at least a portion of the vapor) produced by the cold plates flows from the primary return line, through the secondary return line 12, and is received by the secondary condenser 4 that condenses the vapor back into liquid coolant, which is then supplied by the secondary condenser, via the secondary supply line 11, to the primary supply line 9. In one embodiment, the opening of the primary valve 13 allows excess vapor (e.g., additional vapor that the primary condenser 3 cannot efficiently condense) to be condensed by the secondary condenser. In some embodiments, the primary valve may be a proportional valve that (e.g., automatically) adjusts its opening ratio to provide a proportional change in output pressure (e.g., pressure at an outlet of the valve that is coupled to the secondary return line) that is similar to (or the same as) a change in input pressure (e.g., pressure at an inlet of the valve that is coupled to the primary return line 10).

As shown in this figure, however, the cooling system 1 is using the primary heat-transfer loop, but not the secondary heat-transfer loop to phase-change cool the electronic rack. For instance, the supply lines 9 and 19, and the supply distribution manifold 7 are supplying liquid coolant (e.g., as condensate) to the cold plates 21a-21n (as illustrated as being sold black lines), while the return lines 10 and 20, and the return distribution manifold 8 are for returning vapor (e.g., vaporized liquid coolant) from the cold plates to the primary condenser 3 (as illustrated as being dashed black lines). The primary valve 13 is closed, and thus vapor is not flowing through the secondary return line 12 and condensate is not flowing from the secondary condenser 4, via the secondary supply line 11, to the primary supply line (as illustrated by the secondary return and supply lines being dotted black lines).

The controller 6 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory. In one embodiment, the controller may be a part (or integrated) into the electronic rack 2, as shown. In another embodiment, the controller may be a part of (or one of) the pieces of IT equipment mounted within the electronic rack. The controller is configured to perform one or more phase-change operations to cool the pieces of IT equipment mounted within the electronic rack. More about these operations are described herein.

As described herein, the cooling system creates the second heat-transfer loop in response to a vapor pressure of vapor (flowing) within the first heat-transfer loop exceeding a pressure threshold. In one embodiment, the pressure threshold may be a vapor pressure that corresponds to the electronic rack operating at (or above) a high-power workload. For example, when the vapor pressure is below the pressure threshold, the (e.g., pieces of IT equipment $5a$-$5n$ of the) electronic rack 2 may be operating under or at nominal operating conditions (e.g., by drawing less power than a (maximum) power density (or threshold) and) in which the IT components of the rack are generating a manageable amount of heat that can be dissipated by the primary condenser. In particular, a (primary) cooling capacity of the primary condenser is greater than (or equal to) the heat generated by the pieces of IT equipment, while the equipment is not operating at the high-power workload. Thus, the primary cooling capacity can efficiently and effectively condense the vapor being produced by the cold plates $21a$-$21n$ when the rack is operating at normal power load conditions in which the rack does not draw power exceeding a power threshold. If, however, the pieces of IT equipment are processing high-power workloads (e.g., when the IT equipment have a power density above the power threshold), the IT components may produce additional heat, which results in additional vapor being produced by the cold plates. As the volume of vapor increases within the electronic rack (e.g., within the primary return line 10), the vapor pressure also increases. As a result, the cooling system 1 is configured enable the secondary heat-transfer loop as needed (e.g., during high-power density workloads of the pieces of IT equipment). In one embodiment, the cooling system 1 always uses the primary heat-transfer loop to liquid cool the equipment within the electronic rack.

In one embodiment, the controller 6 is configured to determine the pressure threshold (at which the primary valve 13 is to be opened) based on a configuration of the electronic rack 2. The configuration of the electronic rack may include the number and/or type of pieces of IT equipment (and the IT components of the equipment) that are mounted within the rack. From the configuration of the electronic rack, the controller may determine a maximum power threshold (or workload) of the electronic rack. For example, each of the pieces of IT equipment may have a power requirement and/or a power threshold at which the equipment is to operate. The controller may aggregate this information of all of the equipment mounted within the electronic rack to determine the maximum power threshold of the rack. In one embodiment, the controller may determine this power information regarding the equipment in various ways. For example, the controller may retrieve the power requirements from the equipment once it is installed within the rack (e.g., the controller may be communicatively coupled with each piece of IT equipment). In another embodiment, the controller may receive power information from a user (e.g., from a user terminal) upon population of the electronic rack. In addition to (or in lieu of) the configuration of the rack, the pressure threshold may be based on a cooling capacity of the primary condenser. In one embodiment, the cooling capacity may be determined upon population of the rack with the condenser. In one embodiment, the controller determines the pressure threshold based on heat that is generated by the electronic rack while operating at the maximum power threshold. For instance, the controller may be configured to determine the total heat generated by the electronic rack according to the maximum power threshold, and compare the threshold to the primary cooling capacity of the primary condenser. For instance, the controller may determine whether the primary cooling capacity of the primary condenser is greater than the total heat that may be generated by the electronic rack during high-power workloads. If the maximum power threshold is greater than the primary cooling capacity, the controller may define the pressure threshold according to the primary cooling capacity, which may correspond to a power density of the rack that is less than the maximum power threshold. In another embodiment, the controller may determine the pressure threshold using other methods. In some embodiments, the rack operating profile may be considered by the controller in determining (defining) and setting the pressure threshold.

For example, the controller may input the maximum power and/or the primary condenser cooling (operating) capacity into a predefined vapor pressure model that outputs a vapor pressure value at (or above which) the secondary heat-transfer loop is to be used (in conjunction with the primary heat-transfer loop) to cool the rack. In other words, this may be understood as using the secondary heat-transfer loop to cooling an amount of heat load of the electronic rack that exceeds the cooling capacity of the primary condenser. As another example, the controller may use the maximum power workload to perform a table lookup into a data structure that that associates power values with a vapor pressure value.

In another embodiment, the controller may determine the pressure threshold based on a predefined portion (or fraction) of the maximum power workload. For example, upon determining the maximum power workload, the controller may reduce that value by a percentage (e.g., by 50%), resulting in a halved maximum power workload. In one embodiment, this reduced workload may represent at least an average workload of the electronic rack. The controller may determine the pressure threshold, such that the cooling system activates the secondary heat-transfer loop once the equipment mounted within the rack begin to draw at least (or more than) the reduced workload.

In one embodiment, the controller 6 is communicatively coupled (e.g., via control line 22) to the primary valve 13. In some embodiments, the control line may be a wired connection through any communication protocol. In some embodiments, the controller 6 is configured to set an opening pressure of the primary valve according to the pressure threshold by transmitting a control signal (e.g., an electronic signal) over the control line 22 to the primary valve 13. In one embodiment, the controller may dynamically adjust the opening pressure of the primary valve based on changes to the configuration of the electronic rack (e.g., replacing, adding, and/or removal of pieces of IT equipment that have different power requirements), for example. More about dynamically adjusting the opening pressure of the primary valve is described herein.

Figure 2:
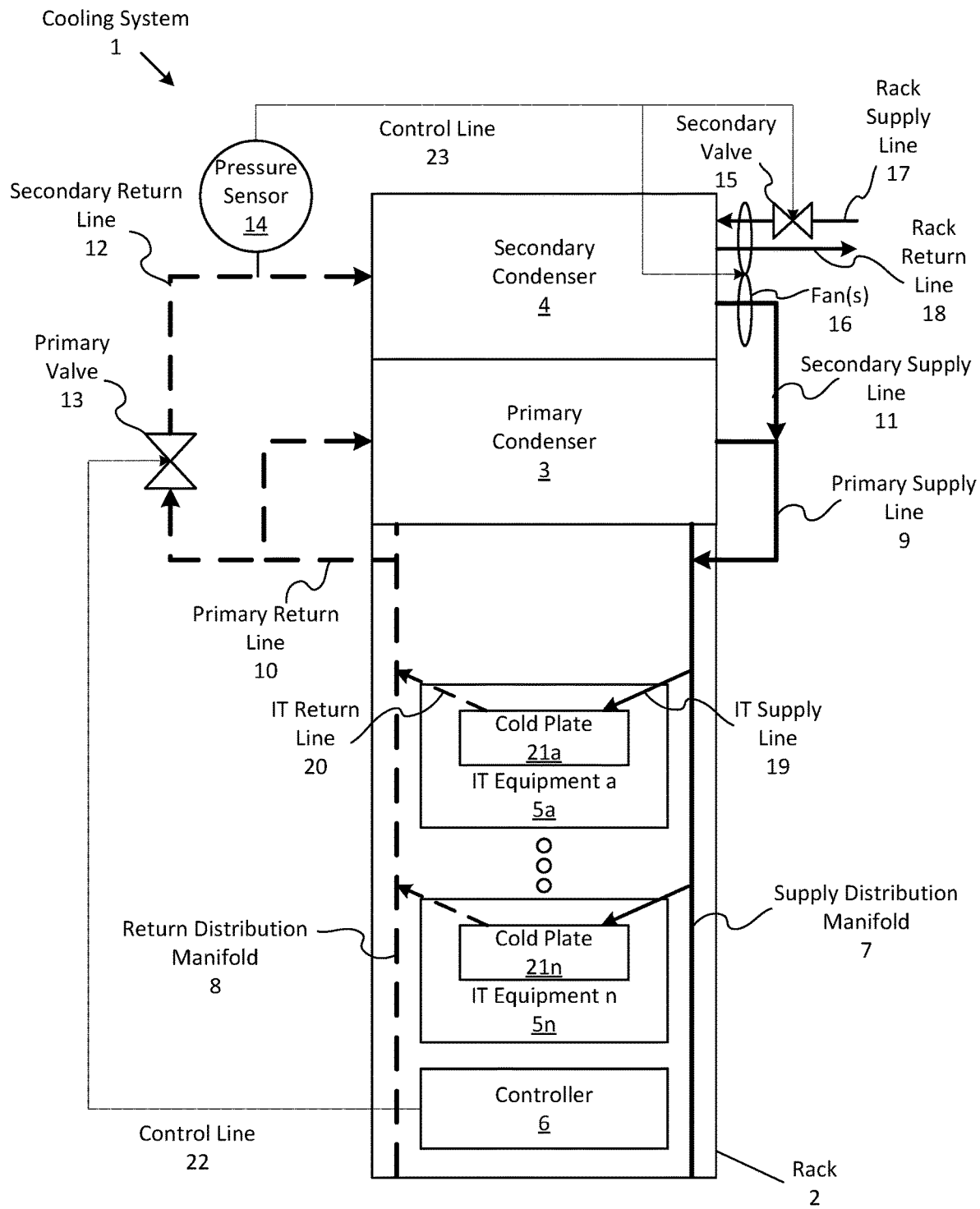
FIG. 2 is a block diagram illustrating an example of the cooling system that is cooling pieces of IT equipment with the primary and a secondary condenser according to one embodiment.

FIG. 2 is a block diagram illustrating an example of the cooling system 1 that is cooling pieces of IT equipment with the primary and a secondary condenser according to one embodiment. Specifically, this figure illustrates that the cooling system is using both the primary and secondary heat-transfer loops to cool the IT equipment $5a$-$5n$, which is a result of the primary valve 13 being at least partially open. This is shown by the secondary return line 12 being a dashed line and the secondary supply line 11 being a solid line. Thus, in this figure the cooling system is using the additional cooling capacity of the secondary condenser 4 to cool the electronic rack, which may be operating under a high-power workload, as described herein.

As described in FIG. 1, the cooling system 1 includes a pressure sensor 14 that is coupled to the secondary return line 12. In one embodiment, the pressure sensor 14 may be any type of sensor (e.g., a piezoelectric pressure sensor, a force collector type, a pressure transducer, etc.) that is configured to detect (or sense) changes in (e.g., vapor) pressure within the secondary return line 12. Specifically, the pressure sensor senses vapor pressure (of vapor flowing through the secondary return line) and produces a corresponding electrical signal that indicates the vapor pressure inside of the line. In another embodiment, however, the pressure sensor may be located anywhere within any of the return lines and/or the return distribution manifold. As shown, the pressure sensor is communicatively coupled (e.g., via a control line 23 that may be a wired connection) with either the one or more fans 16, the secondary valve 15, or both, which may be based on the type of secondary condenser, as described herein.

In one embodiment, the pressure sensor 14 may include processing elements (e.g., a processor, memory, etc.) and may be configured to adjust either 1) a fan speed of the fan(s) 16 or 2) an open ratio of the secondary valve 15 based on the sensed pressure. In particular, the pressure sensor may be configured to sense the vapor pressure, and may be configured to determine the adjustment according to the sensed pressure. The pressure sensor may use the sensed pressure to perform a table lookup into a data structure that associates vapor pressures with fan speeds and/or opening ratios. Upon determining the adjustment, the pressure sensor may transmit a control signal, via the control line 23, to the fan(s) to change the fan speed or to the secondary valve to adjust (e.g., at least partially open) the opening ratio of the valve. For example, the pressure sensor may increase the fan speed or increase the opening ratio as the vapor pressure within the secondary return line increases in order to increase the cooling capacity of the secondary condenser. For instance, as the fan speed increases, the cooling air flowing over the cooling coil increases, which improves the transfer of heat from the coil into the flowing air, thereby increasing the cooling capacity of the secondary condenser.

In some embodiments, the pressure sensor may activate the fan or at least partially open the secondary valve 15 (e.g., from a closed position) in response to sensing a vapor pressure (e.g., a second pressure threshold) that is greater than the (e.g., first) pressure threshold at which the primary valve 13 opens. In one embodiment, the secondary heat-transfer loop may rely on natural convection of the secondary condenser to condense vapor into condensate (e.g., without the fans pushing ambient air over a cooling coil of the secondary condenser or without the rack supply line 17 supplying liquid coolant to the secondary condenser), while the vapor pressure within the secondary return line 12 remains between the first pressure threshold and the second pressure threshold. In such a manner, the cooling system uses natural convection to automatically and passively manage the additional heat generated by the pieces of IT equipment when performing high-power workloads by using the secondary condenser to change fluid phases and circulating the cooling liquid back to the cold plates to draw thermal energy away from the IT components on which the cold plates are mounted. In this way, the cooling system may provide additional phase-change cooling without drawing additional power resources to run the fans and without drawing liquid coolant from a cooling source to increase the cooling capacity of the secondary condenser.

In one embodiment, the condensers may be positioned in order to promote phase-change cooling of the electronic rack. For example, as shown, both the primary and secondary condensers are positioned above the pieces of IT equipment (e.g., along a vertical axis that runs along a height of the electronic rack). By positioning both condensers above the pieces of IT equipment the cooling system uses gravity to draw the vapor produced by the cold plates upward and then to allow the condensate to flow downward back into the cold plates. Thus, vapor and liquid coolant is able to circulate through each (or at least one of) the primary and secondary heat-transfer loops without the use of mechanical devices that promote the circulation naturally. For example, the cooling system circulates the vapor without any vapor pumps (e.g., coupled to any of the return lines) and without any liquid pumps (e.g., coupled to any of the supply lines). In one embodiment, the secondary condenser is positioned above the primary condenser, since the secondary condenser may only be used during high-power workloads of the rack to condense vapor.

Figure 3:
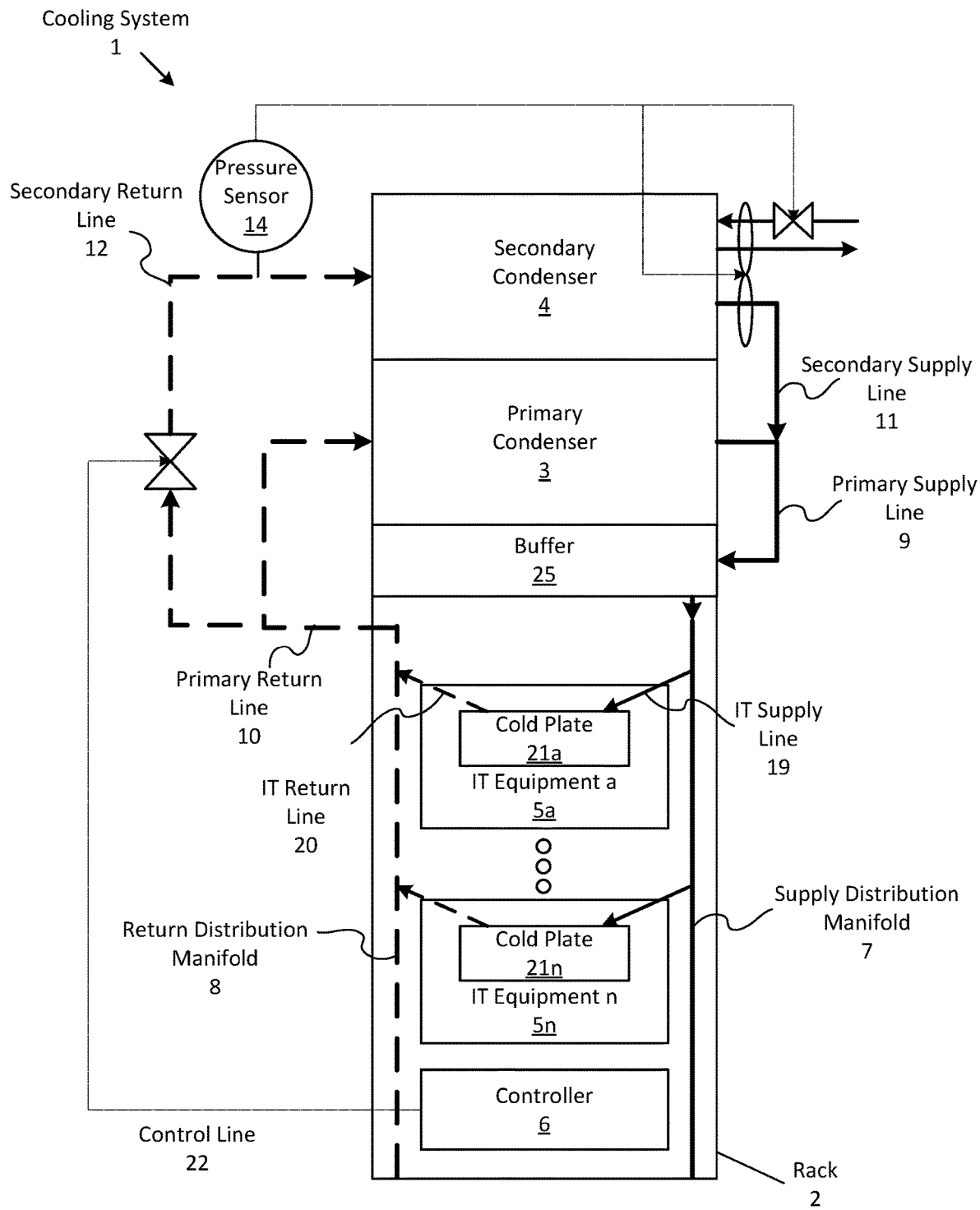
FIG. 3 is a block diagram illustrating another example of the cooling system with a buffer according to one embodiment.

FIG. 3 is a block diagram illustrating another example of the cooling system 1 with a buffer 25 according to one embodiment. Specifically, the cooling system includes the buffer that is designed to store (or accumulate) liquid coolant. As shown, the buffer is coupled between the primary supply line 9 and the supply distribution manifold 7, and therefore stores liquid coolant (or condensate) that is supplied by the primary condenser 3 and/or the secondary condenser 4. The stored liquid coolant is then supplied to the supply distribution manifold to be supplied to the cold plates 21a-21n. In one embodiment, the buffer ensures that the heat-transfer loops have sufficient liquid coolant to cool the cold plates. As shown, the buffer is positioned above the cold plates 21a-21n. This may ensure that a sufficient amount of liquid coolant is always flowing into the cold plates. In some embodiments, the buffer may be coupled elsewhere and/or the cooling system may include two or more buffers. For instance, each condenser may be coupled to a respective buffer.

In one embodiment, the components of the cooling system 1 may couple to one another via connectors. For example, the primary condenser may include a supply port that has a connector that is configured to couple (or connect) to a connector of the primary supply line 9. Similarly, the primary condenser may include a return port that has another connector that connects to a connector of the primary return line 10. In one embodiment, the connectors may be any type of connectors that may be removeably coupled to one another, such as dripless blind mating quick disconnects. In one embodiment, such connectors allow the components to be removeably coupled with one another. As a result, components of the cooling system may be removed and replaced as needed. For example, the primary supply and return lines 9 and 10 may be removed (disconnected) from the primary condenser in order to replace the condenser.

In one embodiment, at least some of the return lines (e.g., lines 10, 12, and/or 20) may be different than at least some of the supply lines (e.g., lines 9, 11, and/or 19). For example, the return lines may have a diameter that is larger than a diameter of the supply lines since the vapor flowing through the return lines may have a greater volume than the liquid coolant flowing through the supply lines. In one embodiment, the supply and return lines may be composed of any material. For instance, the lines may be composed of metal, such as copper, a polymer (e.g., an EPDM rubber), and/or plastic. In one embodiment, the lines may be composed of a flexible material such as rubber.

Figure 4:
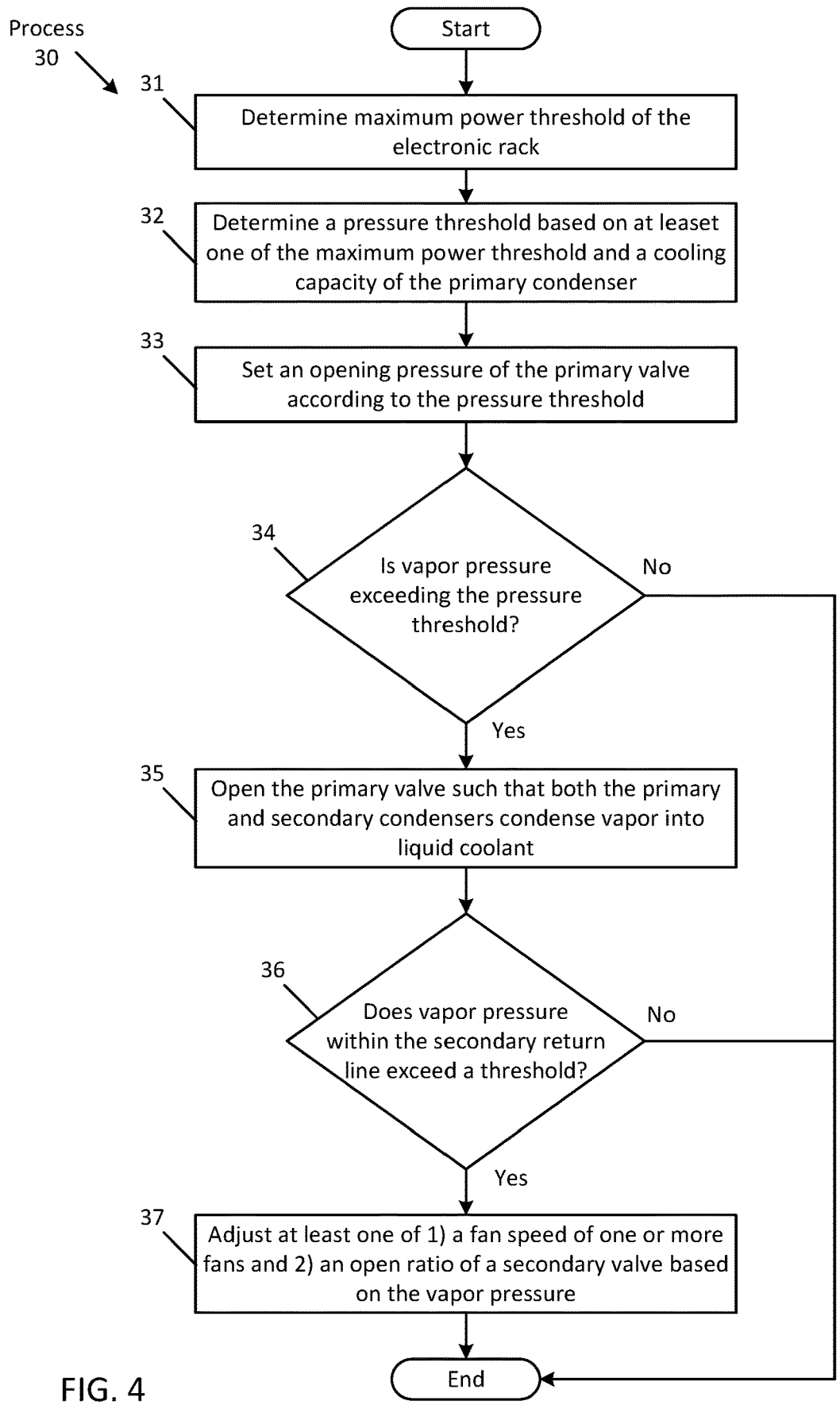
FIG. 4 is a flow chart of a process for liquid cooling pieces of IT equipment according to one embodiment.
Figure 5:
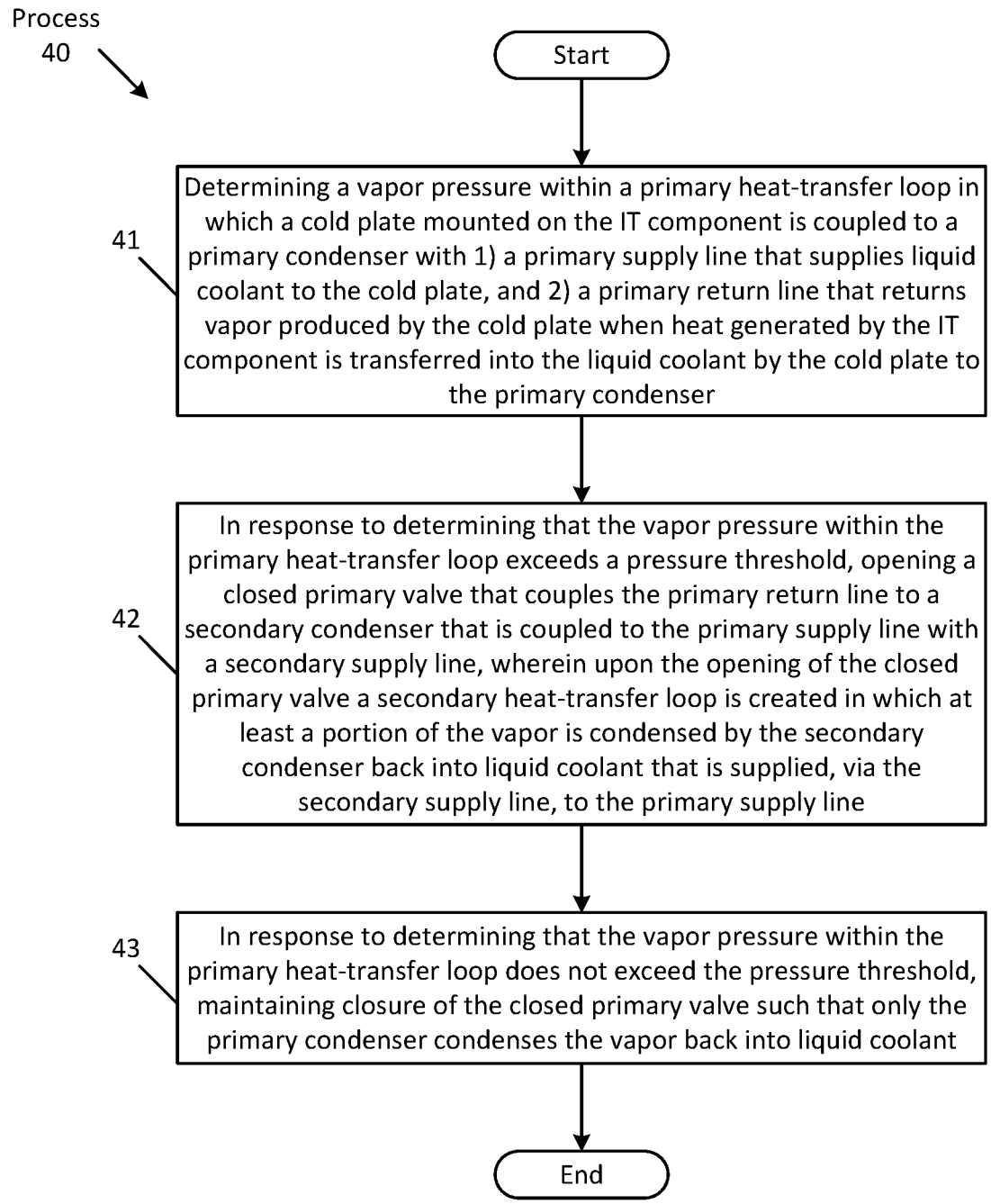
FIG. 5 is a flow chart of another process for liquid cooling pieces of IT equipment according to one embodiment.

FIGS. 4 and 5 are flow charts of processes 30 and 40, respectively, for liquid cooling pieces of IT equipment according to some embodiments. These figures will be described with reference to the cooling system 1 of FIGS. 1 and 2. In one embodiment, at least some of the operations of the processes may be performed by the controller 6, the primary valve 13 and/or the pressure sensor 14.

The process 30 begins by the controller determining a maximum power threshold (e.g., a maximum power density) of (e.g., the pieces of IT equipment mounted within) the electronic rack (at block 31). In particular, once a configuration of the electronic rack is established by populating the rack with pieces of IT equipment (e.g., when the servers are added into the server slots of the rack), the controller may determine a maximum power density of the configuration. As described herein the controller may make this determination based on power information (e.g., that may include power requirements, thresholds, etc.) of the equipment. For instance, the equipment may be communicatively coupled with the controller, and transmit the information once the equipment is installed. In another embodiment, the controller may retrieve this data based on identification information (e.g., model numbers, etc.) of the equipment. The controller determines a pressure threshold based on at least one of the maximum power threshold and a cooling capacity of the primary condenser (at block 32). As described herein, the controller may determine the pressure threshold based on a comparison of the maximum power threshold of the electronic rack and the primary cooling capacity of the primary condenser. The controller sets the opening pressure of the primary valve 13 according to the pressure threshold (at block 33). In one embodiment, the controller transmits a control signal to the primary valve, such that the valve automatically opens when the vapor pressure exceeds the pressure threshold.

The controller 6 determines whether the vapor pressure (e.g., within the primary return line 10) exceeds the pressure threshold (at decision block 34). For example, the cooling system may include an additional pressure sensor that is communicatively coupled with the controller, and is configured to sense the vapor pressure contained within the primary return line 10, for example. If so, the controller opens the primary valve (e.g., by transmitting a control signal via the control line 22), such that both the primary and secondary condensers condense vapor into liquid coolant (at block 35). The controller determines whether the vapor pressure within the secondary return line 12 exceeds a (e.g., pressure) threshold (at decision block 36). As described herein, the pressure sensor 14 may sense the vapor pressure within the secondary return line 12, and this pressure threshold may be different (e.g., greater than) the pressure threshold above which the primary valve (at least partially) opens. If so, the controller adjusts at least one of 1) a fan speed of one or more fans 16 and 2) an open ratio of the secondary valve 15 based on the sensed vapor pressure (at block 37).

As described herein, the pressure threshold may be based on at least the maximum power threshold of the electronic rack and the primary cooling capacity of the primary condenser. These parameters, however, may change over time. For instance, the maximum power threshold may change due to changes in the rack configuration (e.g., pieces of IT equipment being added and/or removed from the electronic rack). Similarly, the primary condenser may be replaced (e.g., due to repairs or failure). As a result, the controller 6 may be configured to perform at least some of the operations of process 30 in response to at least changes in the rack configuration. For instance, in response to a change the controller may at least perform the operations in blocks 31-33 to determine whether the pressure threshold has changed, and to set the opening pressure of the primary valve accordingly. For example, the controller may determine a new maximum power threshold of the electronic rack based on a change to the configuration of the electronic rack (e.g., an addition of more high-power density equipment into the electronic rack), may determine a new pressure threshold based on the new power threshold, and set the opening pressure of the primary valve accordingly. In another embodiment, the controller may reevaluate that the pressure threshold satisfies the cooling requirements of the electronic rack periodically (e.g., at least once a day, a week, a month, etc.). As described herein, FIG. 5 is a flow chart of process 40 for liquid cooling pieces of IT equipment according to one embodiment. The process 40 begins by the controller 6 determining a vapor pressure within a primary heat-transfer loop in which a cold plate mounted on an IT component is coupled to a primary condenser with 1) a primary supply line that supplies liquid coolant to the cold plate, and 2) a primary return line that returns vapor produced by the cold plate when heat generated by the IT component is transferred into the liquid coolant by the cold plate to the primary condenser (at block 41). In response to determining that the vapor pressure within the primary heat-transfer loop exceeds a pressure threshold, the controller opens a closed primary valve that couples the primary return line to a secondary condenser that is coupled to the primary supply line with a secondary supply line, where upon the opening of the closed primary valve a secondary heat-transfer loop is created in which at least a portion of the vapor is condensed by the secondary condenser back into liquid coolant that is supplied, via the secondary supply line, to the primary supply line (at block 42). In response to determining, however, that the vapor pressure within the primary heat-transfer loop does not exceed the pressure threshold, the controller maintains closure of the closed primary valve such that only the primary condenser condenses the vapor back into liquid coolant (at block 43).

In one embodiment, at least some of the operations described in processes 30 and 40 may be periodically performed. Specifically, the (e.g., controller 6 of the) cooling system 1 may perform at least some of the operations while the electronic rack is operating (e.g., while one or more pieces of IT equipment are processing data, as described herein). For instance, the operations to determine the pressure threshold based on the maximum power threshold may be performed periodically based on changes to one or more pieces of IT equipment power requirements and/or changes to the cooling capacity of the primary and secondary condensers. As described herein, the pressure threshold is based on a maximum power threshold or density of the electronic rack, which may be determined based on specification data of the equipment. In another embodiment, the maximum power threshold may be based on historical power density of the equipment while operating within the electronic rack over a period of time (e.g., a day, a week, a month, etc.). For example, over the period of time the controller may determine that the electronic rack draws an average power density that is less than the maximum power density. In one embodiment, the controller may determine the pressure threshold based on the average power density.

Some embodiments may perform variations to the processes 30 and 40. For example, the specific operations of the process may not be performed in the exact order shown and described. The specific operations may not be performed in one continuous series of operations and different specific operations may be performed in different embodiments. For example, as described herein, the operations of these processes are performed by the controller 6 of the cooling system 1. In another embodiment, however, other components may perform at least some of the operations, as described herein. For instance, the primary valve 13 may automatically open in response to the vapor pressure exceeding the pressure threshold, at block 35. As another example, the pressure sensor 14 may determine whether the vapor pressure within the secondary return line exceeds a pressure threshold and perform an adjustment accordingly, at blocks 36 and 37.

As previously explained, an embodiment of the disclosure may be (or include) a non-transitory machine-readable medium (such as microelectronic memory) having stored thereon instructions, which program one or more data processing components (generically referred to here as a "processor") to perform phase-change cooling operations, such as determining a pressure threshold and setting an opening pressure of the primary valve according to the threshold. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling system for an electronic rack, the cooling system comprising:
    a primary condenser;
    a primary supply line and a primary return line that couples the primary condenser to a cold plate that is mounted on an IT component of a piece of information technology (IT) equipment that is disposed within the electronic rack to create a primary heat-transfer loop in which the primary condenser 1) supplies, via the primary supply line, a liquid coolant to the cold plate and 2) receives, via the primary return line, a vapor that is produced by the cold plate when heat generated by the IT component is transferred into the liquid coolant by the cold plate;
    a secondary condenser;
    a secondary supply line that couples the secondary condenser to the primary supply line;
    a secondary return line that couples the secondary condenser to the primary return line; and
    a primary valve that is coupled to the secondary return line,
    wherein the primary valve is configured to at least partially open in response to a vapor pressure exceeding a pressure threshold,
    wherein, in response to the primary valve at least partially opening, a secondary heat-transfer loop is created in which the secondary condenser receives, via the secondary return line, at least a portion of the vapor and condenses the at least the portion of the vapor back into the liquid coolant that is supplied, via the secondary supply line, to the primary supply line.

2. The cooling system of claim 1 further comprising either 1) a fan that is arranged to move ambient air over a cooling coil of the secondary condenser or 2) a rack supply line and a rack return line that couples the secondary condenser to a cooling source and a secondary valve that is coupled to either the rack supply line or the rack return line.

3. The cooling system of claim 2 further comprising a pressure sensor that is coupled to the secondary return line and is communicatively coupled to either the fan or the secondary valve, wherein the pressure sensor is configured to
    sense the vapor pressure within the secondary return line, and
    adjust either 1) a fan speed of the fan or 2) an open ratio of the secondary valve based on the sensed vapor pressure.

4. The cooling system of claim 1 further comprising a controller that is communicatively coupled to the primary valve, wherein the controller is configured to
    determine the pressure threshold based on at least one of a maximum power threshold of the electronic rack and a cooling capacity of the primary condenser; and
    set an opening pressure of the primary valve according to the pressure threshold.

5. The cooling system of claim 1 further comprising:
    a supply distribution manifold that couples the primary supply line to the cold plate; and
    a return distribution manifold that couples the primary return line to the cold plate.

6. The cooling system of claim 5 further comprising a liquid coolant buffer that is coupled between the primary supply line and the supply distribution manifold.

7. The cooling system of claim 1, wherein the secondary condenser is positioned above the primary condenser, which is positioned above the piece of IT equipment, wherein the vapor and the liquid coolant circulates through each of the primary and secondary heat-transfer loops without any vapor pumps and without any liquid pumps.

8. The cooling system of claim 1, wherein the primary condenser is a first type of two-phase heat exchanger and the secondary condenser is a second type of two-phase heat exchanger.

9. An electronic rack comprising:
    a plurality of pieces of information technology (IT) equipment arranged in a stack for providing data processing services, each piece of IT equipment including one or more processors;

a primary condenser;
a primary supply line and a primary return line that couples the primary condenser to a cold plate that is mounted on a processor of a piece of IT equipment of the plurality of pieces of IT equipment to create a primary heat-transfer loop in which the primary condenser 1) supplies, via the primary supply line, a liquid coolant to the cold plate and 2) receives, via the primary return line, a vapor that is produced by the cold plate when heat generated by the processor is transferred into the liquid coolant by the cold plate;
a secondary condenser;
a secondary supply line that couples the secondary condenser to the primary supply line;
a secondary return line that couples the secondary condenser to the primary return line; and
a primary valve that is coupled to the secondary return line,
wherein the primary valve is configured to at least partially open in response to a vapor pressure exceeding a pressure threshold,
wherein, in response to the primary valve at least partially opening, a secondary heat-transfer loop is created in which the secondary condenser receives, via the secondary return line, at least a portion of the vapor and condenses the at least the portion of the vapor back into the liquid coolant that is supplied, via the secondary supply line, to the primary supply line.

10. The electronic rack of claim 9 further comprising either 1) a fan that is arranged to move ambient air over a cooling coil of the secondary condenser or 2) a rack supply line and a rack return line that couples the secondary condenser to a cooling source and a secondary valve that is coupled to either the rack supply line or the rack return line.

11. The electronic rack of claim 10 further comprising a pressure sensor that is coupled to the secondary return line and is communicatively coupled to either the fan or the secondary valve, wherein the pressure sensor is configured to
sense the vapor pressure within the secondary return line, and
adjust either 1) a fan speed of the fan or 2) an open ratio of the secondary valve based on the sensed vapor pressure.

12. The electronic rack of claim 9 further comprising a controller that is communicatively coupled to the primary valve, wherein the controller is configured to
determine the pressure threshold based on at least one of a maximum power threshold of the electronic rack and a cooling capacity of the primary condenser; and
set an opening pressure of the primary valve according to the pressure threshold.

13. The electronic rack of claim 9 further comprising:
a supply distribution manifold that couples the primary supply line to the cold plate; and
a return distribution manifold that couples the primary return line to the cold plate.

14. The electronic rack of claim 13 further comprising a liquid coolant buffer that is coupled between the primary supply line and the supply distribution manifold.

15. The electronic rack of claim 9, wherein the secondary condenser is positioned above the primary condenser, which is positioned above the plurality of pieces of IT equipment, wherein the vapor and the liquid coolant circulates through each of the primary and secondary heat-transfer loops without any vapor pumps and without any liquid pumps.

16. The electronic rack of claim 9, wherein the primary condenser is a first type of two-phase heat exchanger and the secondary condenser is a second type of two-phase heat exchanger.

17. A method for liquid cooling an information technology (IT) component of a piece of IT equipment that is mounted within an electronic rack, the method comprising:
determining a vapor pressure within a primary heat-transfer loop in which a cold plate mounted on the IT component is coupled to a primary condenser with 1) a primary supply line that supplies a liquid coolant to the cold plate, and 2) a primary return line that returns a vapor produced by the cold plate when heat generated by the IT component is transferred into the liquid coolant by the cold plate to the primary condenser;
in response to determining that the vapor pressure within the primary heat-transfer loop exceeds a pressure threshold, opening a closed primary valve that couples the primary return line to a secondary condenser that is coupled to the primary supply line with a secondary supply line, wherein upon the opening of the closed primary valve a secondary heat-transfer loop is created in which at least a portion of the vapor is condensed by the secondary condenser back into the liquid coolant that is supplied, via the secondary supply line, to the primary supply line; and
in response to determining that the vapor pressure within the primary heat-transfer loop does not exceed the pressure threshold, maintaining closure of the closed primary valve such that only the primary condenser condenses the vapor back into the liquid coolant.

18. The method of claim 17, wherein the primary valve is coupled to a secondary return line that couples the primary return line to the secondary condenser, wherein the method further comprises:
sensing the vapor pressure within the secondary return line; and
adjusting either 1) a fan speed of a fan that is arranged to move ambient air over a cooling coil of the secondary condenser or 2) an open ratio of a secondary valve that couples the secondary condenser to a liquid cooling source based on the sensed vapor pressure.

19. The method of claim 17 further comprising:
determining the pressure threshold based on at least one a maximum power threshold of the electronic rack and a cooling capacity of the primary condenser; and
setting an opening pressure of the primary valve according to the pressure threshold.

20. The method of claim 19 further comprising determining a new maximum power threshold of the electronic rack based on a change to a configuration of the electronic rack;
determining a new pressure threshold based on at least the new maximum power threshold; and
setting the opening pressure of the primary valve according to the new pressure threshold.

\* \* \* \* \*